(12) United States Patent
Kulkarni et al.

(10) Patent No.: US 9,947,388 B2
(45) Date of Patent: Apr. 17, 2018

(54) REDUCED SWING BIT-LINE APPARATUS AND METHOD

(71) Applicant: Intel Corporation, Santa Clara, CA (US)

(72) Inventors: Jaydeep P. Kulkarni, Hillsboro, OR (US); Iqbal R. Rajwani, Roseville, CA (US); Eric K. Donkoh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/072,278

(22) Filed: Mar. 16, 2016

(65) Prior Publication Data

US 2017/0270998 A1 Sep. 21, 2017

(51) Int. Cl.
*G11C 7/22* (2006.01)
*G11C 11/419* (2006.01)

(52) U.S. Cl.
CPC .................. *G11C 11/419* (2013.01)

(58) Field of Classification Search
None
See application file for complete search history.

(56) References Cited

U.S. PATENT DOCUMENTS

| | | | |
|---|---|---|---|
| 6,011,743 A | 1/2000 | Khang | |
| 6,856,547 B2 | 2/2005 | Poidomani et al. | |
| 6,999,372 B2 | 2/2006 | Takayanagi | |
| 8,488,390 B2 | 7/2013 | Kulkarni et al. | |
| 2007/0236256 A1* | 10/2007 | Cherukuri | H03K 19/0016 327/1 |
| 2008/0310246 A1* | 12/2008 | Joshi | G11C 11/413 365/230.06 |
| 2014/0169089 A1 | 6/2014 | Castro | |
| 2014/0169109 A1* | 6/2014 | Donkoh | G11C 11/418 365/191 |
| 2015/0009751 A1* | 1/2015 | Kulkarni | G11C 5/145 365/156 |
| 2015/0213858 A1* | 7/2015 | Tao | G11C 7/12 365/191 |

OTHER PUBLICATIONS

International Search Report and Written Opinion dated May 12, 2017 for PCT Patent Application No. PCT/US17/16050.

* cited by examiner

*Primary Examiner* — Son Dinh
*Assistant Examiner* — Sultana Begum
(74) *Attorney, Agent, or Firm* — Green, Howard & Mughal LLP

(57) ABSTRACT

Described is an apparatus which comprises: a bit-line (BL) read port; a first local bit-line (LBL) coupled to the BL read port; a second LBL; and one or more clipper devices coupled to the first and second LBLs. The apparatus allows for low swing bit-line to be used for large signal memory arrays. The low swing operation enables reduction in switching dynamic capacitance. The apparatus also describes a split input NAND/NOR gate for bit-line keeper control which achieves lower $V_{MIN}$, higher noise tolerance, and improved keeper aging mitigation. Described is also an apparatus for low swing write operation which can be enabled at high voltage without degrading the low voltage operation.

20 Claims, 12 Drawing Sheets

US 9,947,388 B2

REDUCED SWING BIT-LINE APPARATUS AND METHOD

BACKGROUND

Register Files (RF), Read Only Memories (ROMs) and Content Addressable Memories (CAMs) usage is increasing rapidly in modern microprocessor and SoC (System-on-Chip) designs due to their energy efficient local storage/access to feed various compute blocks such as Arithmetic Logic Unit (ALU), accelerators, graphics execution units, etc. Supply voltage scaling, which is an effective knob for improving energy efficiency, is governed by the memory array $V_{MIN}$ or the data path logic $V_{MIN}$. Here, the term "$V_{MIN}$" or "minimum operating voltage" generally refers to the lowest operating voltage level below which the memory will lose its data. Lowering the $V_{MIN}$ for memory (when that $V_{MIN}$ is the limiter) and/or reducing memory dynamic power at ISO-$V_{MIN}$ (when the $V_{MIN}$ of the logic is the limiter) is preferred for improved energy efficiency of the entire design.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
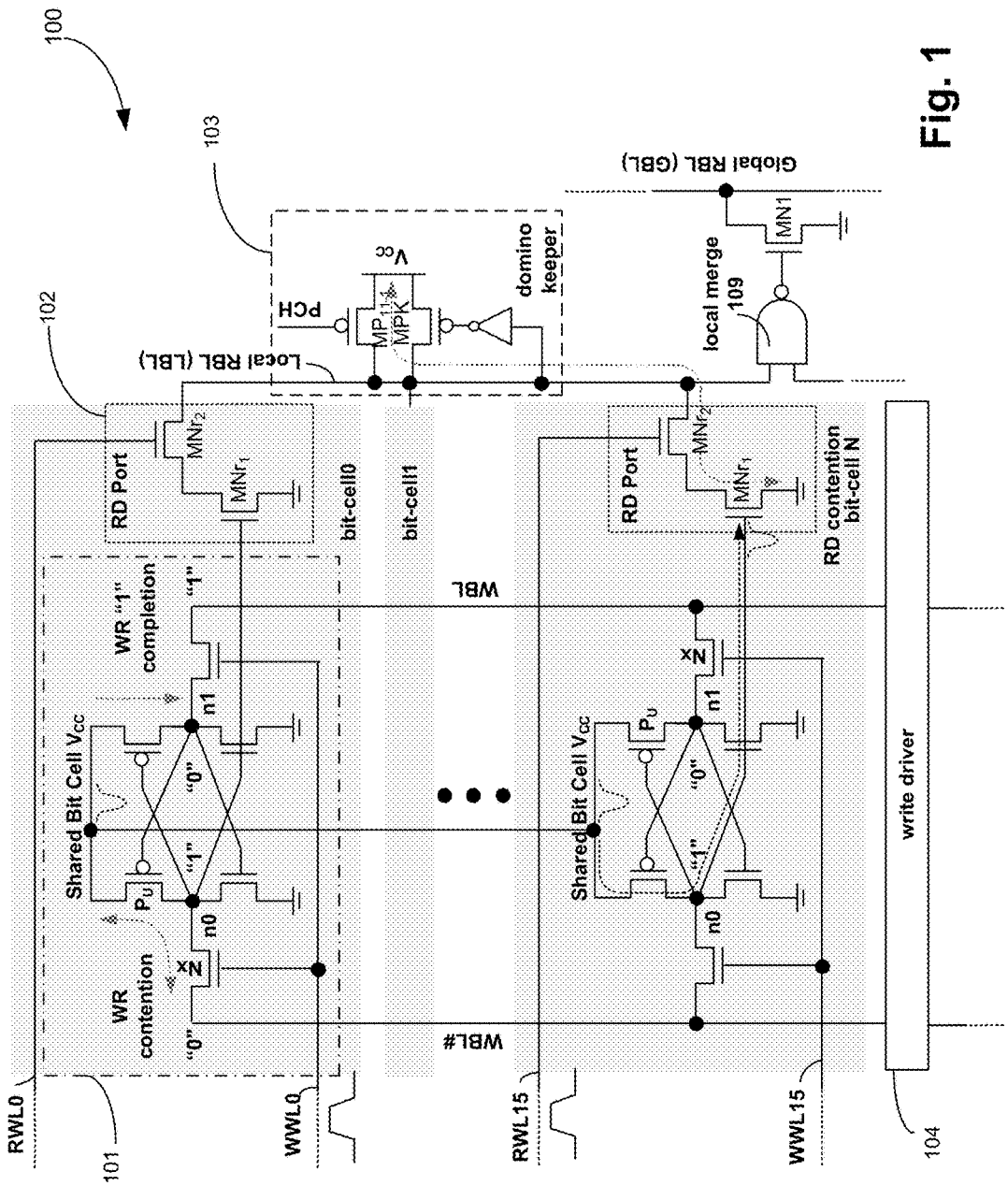
FIG. 1 illustrates a register file (RF) with full swing bit-line (BL) operation with an n-type read port.

Some embodiments describe an apparatus which comprises: a bit-line (BL) read port; a first local bit-line (LBL) coupled to the BL read port; a second LBL; and one or more clipper devices coupled to the first and second LBLs. The apparatus allows for low swing BL to be used for large signal memory arrays, according to some embodiments. The low swing operation enables reduction in switching dynamic capacitance, according to some embodiments. The apparatus of some embodiments also uses a split input NAND/NOR gate for BL keeper control which achieves lower $V_{MIN}$, higher noise tolerance, and improved keeper aging mitigation. Some embodiments also describe an apparatus for low swing write operation which can be enabled at high supply voltage without degrading the low voltage operation.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a register file (RF) 100 with full swing BL operation with an n-type read port, in accordance with some embodiments. FIG. 1 shows a baseline one read and one write (1R/1W) RF design with hierarchical local and global read BLs utilizing a single-ended large signal read sensing mechanism. RF 100 includes memory cells (e.g., 101) with read ports (e.g., 102), domino keeper 103, write driver 104, local read bit-line (LBL), local merge logic 109, global read bit-line (GBL), read word-lines (RWLs), write word-lines (WWLs), and write bit-lines (WBLs).

Here, sixteen 8-T (eight transistor) Static Random Access Memory (SRAM) bit cells are shown (e.g., bit-cell 0, bit-cell 1 . . . bit-cell N, where 'N' is an integer) organized in a column. For example, 'N' can be 7, 15, ad 31. Each bit-cell receives its own RWL and WWL, and shares WBL and its inverse (i.e., WBL#) with other bit-cells in the same column. While various embodiments here are described with reference to an 8-T SRAM architecture, the embodiments are also applicable to other types of memories such as 4-T, 6-T, SRAMs, Read Only Memories (ROMs) and Content Addressable Memories (CAMs).

Continuing with the example of the 8-T bit-cell, each bit-cell includes a 6-T memory cell 101 and a 2-T read port 102. The 6-T memory cell 101 includes cross-coupled inverters powered by a shared bit-cell $V_{CC}$ (power supply). The cross-coupled inverters include two p-type transistors and two n-type transistors as shown such that node n0 is input to one inverter and output to the other inverter, and node n1 is input to one inverter and output to the other inverter. The 6-T memory cell includes access devices coupled to nodes n0 and n1, and coupled to WBL and WBL#, respectively. The gate terminals of the access devices (here, n-type devices) are controlled by the WWL. For example, for bit-cell 0, the access devices are controlled by WWL0, for bit-cell 1, the access devices are controlled by WWL1, and so on such that the access devices for bit-cell 15 are controlled by WWL15.

The read port (RD Port) 102 includes two n-type devices MNr1 and MNr2. N-type transistor MNr1 is coupled in series with transistor MNr2. The gate terminal of the n-type transistor MNr2 is controlled by RWL0, while the gate terminal of transistor MNr1 is coupled to a data node (e.g., one of nodes n0 or n1). The output of RD Port 102 is LBL. The charge on LBL is held by domino keeper 103. Each LBL may have its own domino keeper. Domino keeper 103 includes a pre-charge p-type transistor MP11-1 which is controlled by a pre-charge signal (PCH). Domino keeper 103 includes a keeper device (or domino keeper) MPK controlled by an inverter having an input coupled to LBL and an output coupled to the gate terminal of p-type transistor MPK. While FIG. 1 shows one keeper device MPK, in some embodiments, to reduce contention and assist timing there can be one or more p-type transistors such that the gate terminals of the one or more p-type transistors is controlled by an inverter while the other gate terminals of the p-type keeper are tied to Vss (ground).

The read port of the multiple bit-cells (e.g., 16, 32, or 64) are evaluated using local read merge NAND gate 109. The outputs of merge NAND gate 109 drive the global BL pulldown devices (e.g., n-type transistor MN1). The global BLs (GBLs) are evaluated using a Set Dominant Latch (SDL) or a regular latch.

In some embodiments, a tristate write BL driver (not shown here) is provided which is shared by multiple entries/bundles of memory cells. In some embodiments, the tristate write BL driver allows additional power savings by avoiding WBL toggling in unselected bundles of memory cells and also by lowering the driver leakage due to a stacking effect. The various embodiments are not limited to tristate write BL drivers. In some embodiments, inverter based (non-tristate) write drivers may be used.

Figure 2:
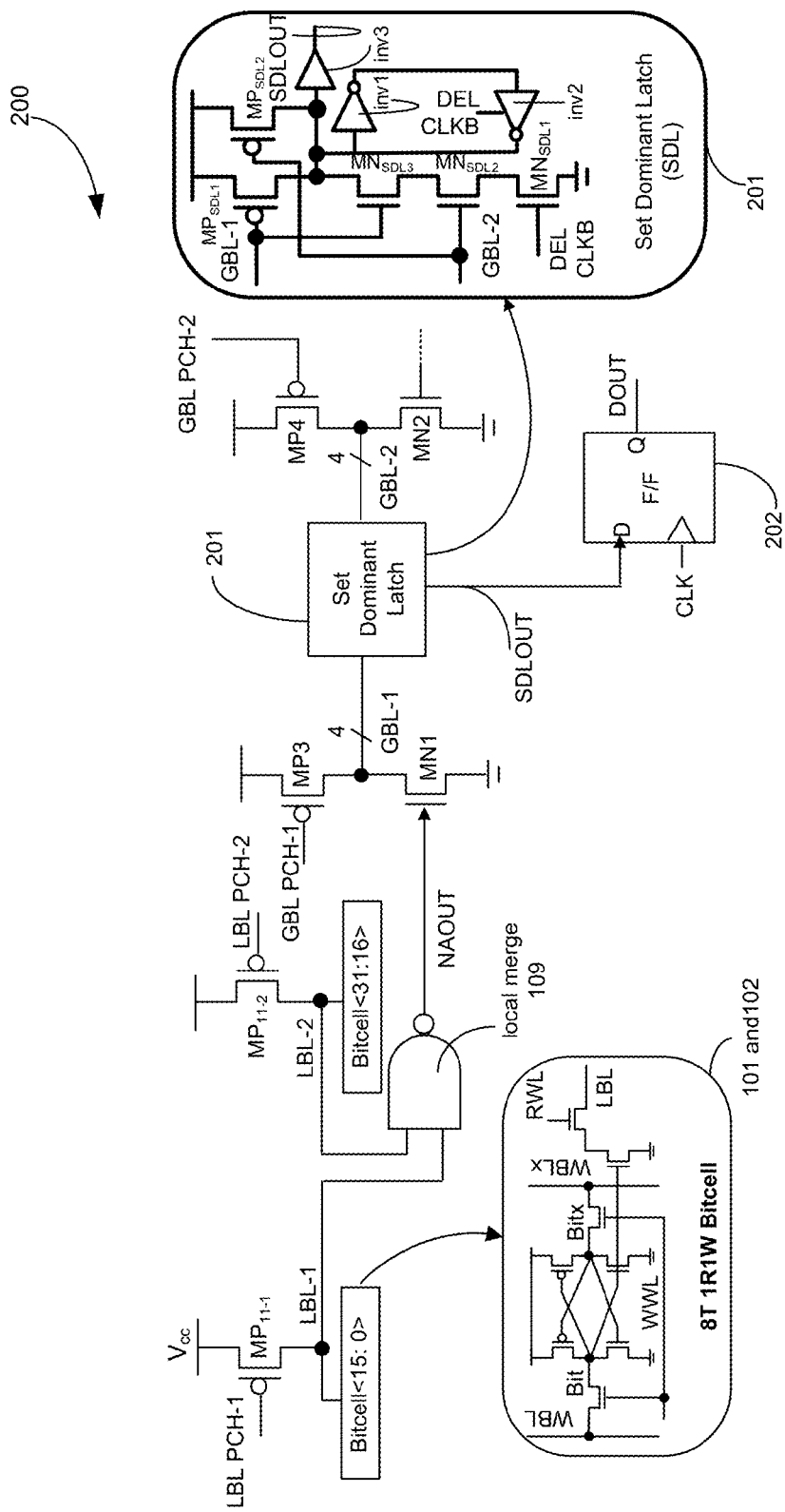
FIG. 2 illustrates the read path of the RF of FIG. 1.

FIG. 2 illustrates read path 200 of the RF of FIG. 1, according to some embodiments of the disclosure. It is pointed out that those elements of FIG. 2 having the same reference numbers (or names) as the elements of any other figure can operate or function in any manner similar to that described, but are not limited to such.

In some embodiments, read path includes SDL 201 and Sampler 202. Read path 200 includes a portion of RF 100 and more details of logic after local merge NAND gate 109. LBLs for each column of bit-cells is received by local merge NAND gate 109. For example, LBL-1 associated with the first set of sixteen bit-cells (e.g., Bitcell<15:0>), and LBL-2 associated with the second set of sixteen bit-cells (e.g., Bitcell<31:16>) are received by local merge NAND gate 109 that provides an output NAOUT. As described with reference to FIG. 1, any number or group of bit-cells may be used. For example, 8, 16, or 32 bit-cells per LBL can be used. Each LBL has a pre-charge controlled device. Here, p-type pre-charge device $MP_{11\text{-}1}$ is coupled to LBL-1 and controlled by LBL PCH-1, and p-type pre-charge device $MP_{11\text{-}2}$ is coupled to LBL-2 and controlled by LBL PCH-2.

The output NAOUT controls the pull-down device MN1 which pull-downs GBL-1 (which may be a multi-bit bus (e.g., 4 bits)). For example, GBL-1 may refer to node GBL-1 or signal GBL-1 depending on the context of the sentence. In some embodiments, a p-type device MP3 is coupled in series with the pull-down transistor MN1, where transistor MP3 is controlled by a first pre-charge GBL signal GBL PCH-1. SDL 201 latches signals on GBLs that provides an output SDL OUT. Here, signal names and nodes names are interchangeably used. For example, a second GBL-2 from another bank of memory cells is also received by SDL 201.

Here, GBL-2 is provided by the series output transistors MP4 and MN2, where the p-type transistor MP4 is controlled by pre-charge GBL signal GBL PCH-2. One embodiment of SDL 201 is illustrated in FIG. 2. SDL 201 comprises transistors $MN_{SDL1}$, $MN_{SDL2}$, $MN_{SDL3}$, $MP_{SDL1}$, and $MP_{SDL2}$, inverter inv1, clock enabled inverter inv2 (enabled by delayed clock DEL CLKB, which is an inverse of CLK), and buffer inv3 coupled together as shown. The gates of transistors $MP_{SDL1}$ and $MN_{SDL3}$ are controlled by GBL-1. The gates of transistors $MN_{SDL2}$ and $MP_{SDL2}$ are controlled by GBL-2. The gate of transistor $MN_{SDL1}$ is controlled by DEL CLKB. The output of SDL 201 is SDLOUT which is then sampled by flip-flop 202 to provide output data DOUT.

Figure 3:
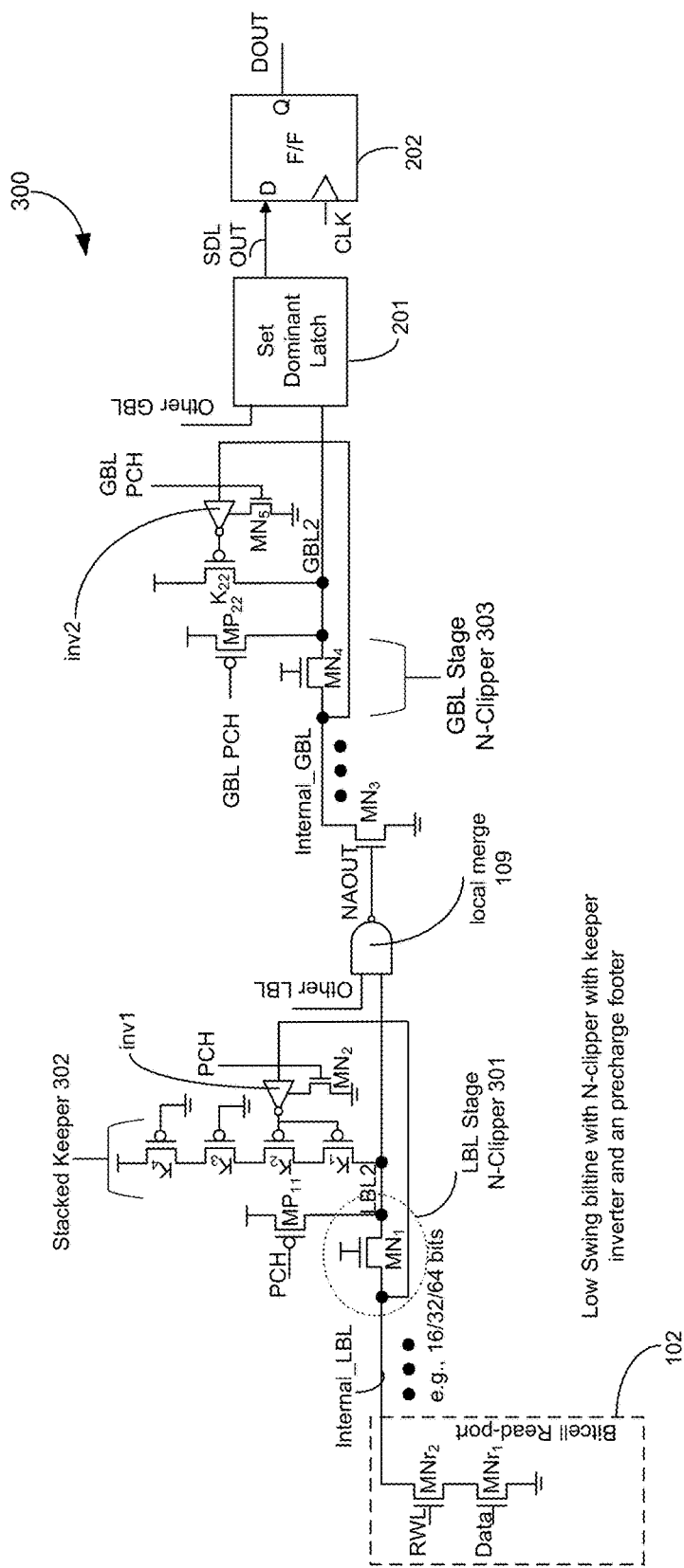
FIG. 3 illustrates an apparatus showing low-swing local read BL sensing scheme with an n-type clipper and global read BL sensing with an n-type clipper, according to some embodiments of the disclosure.

FIG. 3 illustrates apparatus 300 showing low-swing local read BL sensing scheme with n-type clipper and global read BL sensing with n-type clipper, according to some embodiments of the disclosure. It is pointed out that those elements of FIG. 3 having the same reference numbers (or names) as the elements of any other figure can operate or function in any manner similar to that described, but are not limited to such.

In some embodiments, apparatus 300 comprises a LBL Stage n-type Clipper 301 which is inserted in the LBL such that the LBL is split into Internal_LBL coupled to bit-cell read-port 102 and LBL2. In some embodiments, LBL2 is merged with other LBL2s (from other read paths) by local merge NAND gate 109. In some embodiments, n-type Clipper 301 is always on. For example, the gate terminal of n-type Clipper 301 is coupled to Vcc (power supply). By inserting n-type Clipper 301 between the bit-cell read port 102 and the local merge NAND gate 109, the voltage swing on higher capacitance Internal_LBL node is reduced to Vcc-Vt instead of Vcc (baseline design). As such, low swing is achieved.

In some embodiments, one or more n-type devices (not shown) are coupled in series with n-type Clipper 301 to further reduce the signal swing on Internal_LBL node, in accordance with some embodiments. In some embodiments, the Internal_LBL node, which is coupled to the bit-cell read ports 102 (having most of the capacitance), is precharged to the lower voltage (Vcc-Vtn) thus lowering the dynamic switching capacitance (CDYN). The low swing BL (i.e., Internal_LBL) partially offsets the delay degradation due to series connected n-type Clipper 301 in the read path, according to some embodiments.

In some embodiments, apparatus 300 comprises Stacked Keeper 302 which is coupled to LBL2 node. In some embodiments, Stacked Keeper 302 comprises p-type transistors $K_1$, $K_2$, $K_3$, and $K_4$ coupled together in series. While Stacked Keeper 302 is described having four stacked p-type transistors, fewer or more p-type transistors may be used for forming Stacked Keeper 302. In some embodiments, the gate terminals of p-type transistors $K_3$ and $K_4$ are coupled to ground (i.e., configured to be turned on). In some embodiments, the gate terminals of p-type transistors $K_1$ and $K_2$ are controlled by an output of an inverter which inverts the signal on the Internal_LBL node. As such, when the voltage on the Internal_LBL is higher than the switching threshold of the inverter inv1, the voltage on node LBL2 is pulled to Vcc by Stacked Keeper 302.

In some embodiments, the inverter inv1 coupled to the p-type transistor $K_2$ is enabled by the pre-charge signal (PCH) via n-type transistor $MN_2$. In some embodiments, apparatus 300 comprises p-type transistor $MP_{11}$ which is controlled by PCH. In some embodiments, when PCH is low, LBL2 is pulled to Vcc by the p-type transistor $MP_{11}$ while Stacked Keeper 302 is disabled by transistor $MN_2$.

As discussed with reference to FIG. 2, the output of the local merge NAND gate 109 is NAOUT which is received by pull-down n-type transistor $MN_3$. The transistor $MN_3$ is coupled to the GBL. In some embodiments, an n-type Clipper 303 is also added on the GBL just like n-type Clipper 301 is added on LBL. In some embodiments, n-type Clipper 303 is inserted in the GBL such that the GBL is split into Internal_GBL coupled to the pull-down transistor $MN_3$ and GBL2. In some embodiments, GBL2 is precharged by p-type transistor $MP_{22}$ which is controlled by the GBL PCH. In some embodiments, a keeper is provided to preserve the charge on GBL2 according to the voltage level of Internal_GBL.

In some embodiments, the keeper is like Stacked Keeper 302 but for keeping the charge of GBL2. In some embodiments, the keeper comprises a p-type device $K_{22}$ which is controlled by inverter inv2 that receives Internal_GBL as input. As such, when the voltage on the Internal_GBL is higher than the switching threshold of the inverter inv2, the voltage on node GBL2 is pulled to Vcc by the keeper device $K_{22}$. In some embodiments, the inverter coupled to the p-type transistor $K_{22}$ is enabled by GBL PCH via n-type transistor MN5. As discussed with reference to FIG. 2, the GLB2 is received as input by SDL 201.

Figure 4A:
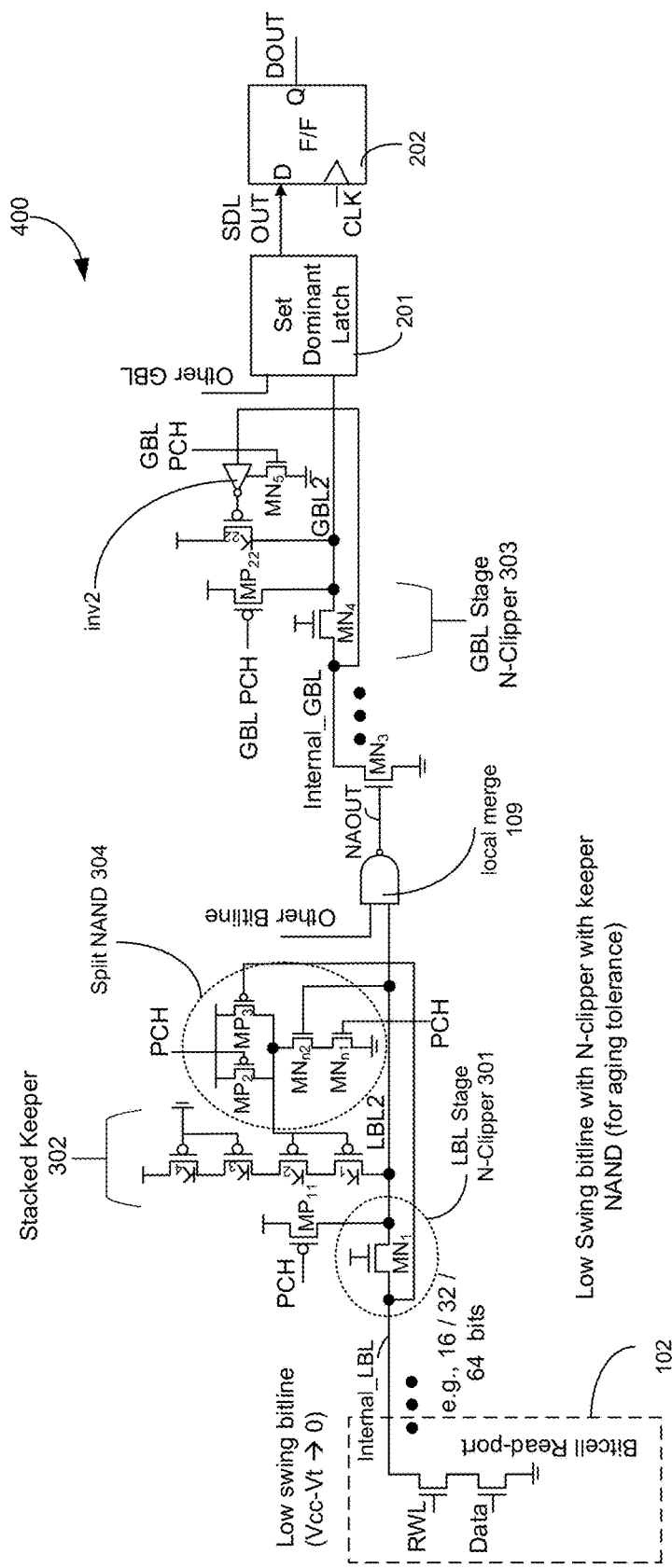
FIG. 4A illustrates apparatus showing low-swing LBL sensing scheme with an n-type clipper and GBL sensing with an n-type clipper, and with split-NAND logic for keeper control, according to some embodiments of the disclosure.

FIG. 4A illustrates apparatus 400 showing low-swing LBL sensing scheme with an n-type clipper and GBL sensing with an n-type clipper, and with split-NAND logic for keeper control, according to some embodiments of the disclosure. It is pointed out that those elements of FIG. 4A having the same reference numbers (or names) as the elements of any other figure can operate or function in any manner similar to that described, but are not limited to such.

In some embodiments, a split NAND 304 is introduced to control keeper device(s). For example, keeper inverter is replaced with split NAND gate 304 which controls the gate terminals of keeper devices $K_1$ and $K_2$. In some embodiments, split NAND 304 comprises p-type transistors $MP_2$ and $MP_3$, and n-type transistors $MN_{n1}$ and $MN_{n2}$ coupled together as shown. In some embodiments, the gate terminal of $MP_3$ is coupled to low swing LBL (i.e., Internal_LBL). In some embodiments, the gate terminal of $MP_2$ is controlled by PCH. In some embodiments, the gate terminal of $MN_{n2}$ is controlled by LBL2. In some embodiments, the gate terminal of $MN_{n1}$ is controlled by PCH.

In some embodiments, to improve the read path delay further, the Internal_LBL is connected to the gate of transistor $MP_3$ of split input NAND gate 304. In some embodiments, as Internal_LBL discharges faster than the LBL2 node, it turns on transistor $MP_3$ faster which in turn disables stacked keeper 302. Earlier turning-off keeper stack mitigates the keeper contention and improves the read path delay, according to some embodiments. As such, in some embodiments, in spite of series n-type clipper 301 in the read path, the read sensing delay is improved using low swing BL and earlier keeper turn-OFF mechanism compared to the baseline full swing BL read sensing scheme of FIGS. 1-2.

Referring back to FIG. 4A, in some embodiments, instead of the feedback inverter driven from the LBL and controlling Stacked Keeper 302, split NAND gate 304 is driven by the Internal_LBL and the PCH. During the precharge phase, Stacked Keeper 302 is turned-OFF lowering the voltage stress across the gate oxide of the p-type transistors $K_1$ and $K_2$ of Stacked Keeper 302. This results in reduced keeper aging and improves the noise immunity. In some embodiments, when the other input of split NAND gate 304 (e.g., inputs to gates of transistors $MP_3$ and $MN_{n2}$) is connected to the Internal_LBL node, it results in faster turn-off of Stacked Keeper 304 and also degrades the noise tolerance as the input to the split NAND gate 302 is biased closer to its switching point.

In some embodiments, during read-1 scenario (e.g., reading a logic high), the voltage on the Internal_LBL and LBL2 nodes discharge to Vss. In some embodiments, the signal on the LBL2 node follows the signal on the Internal_LBL node albeit with additional delay due to series n-type clipper 301 in the read path. In some embodiments, during a transient noise event in a read-0 scenario (e.g., reading a logic 0), the effect of noise is predominant on the Internal_LBL node. The LBL node has better noise immunity due to full swing precharge voltage and the shielding effect due to series connected clipper. This property is utilized to improve the noise immunity of the low swing BL technique by decoupling one of the inputs of the keeper controlled NAND gate, in accordance with some embodiments. In some embodiments, transistor $MN_{n2}$ of split NAND gate 304 is connected to the full swing LBL2 node and the transistor $MP_3$ is connected to the low swing Internal_LBL node.

The low swing BL scheme coupled with split input NAND gate 304 for keeper control gives lower read delay and improved aging and noise immunity compared to the conventional full swing sensing scheme, in accordance with some embodiments. In some embodiments, the low swing BL scheme can be applied to hierarchical BLs utilizing two stage local and global BL sensing schemes.

Figure 4B:
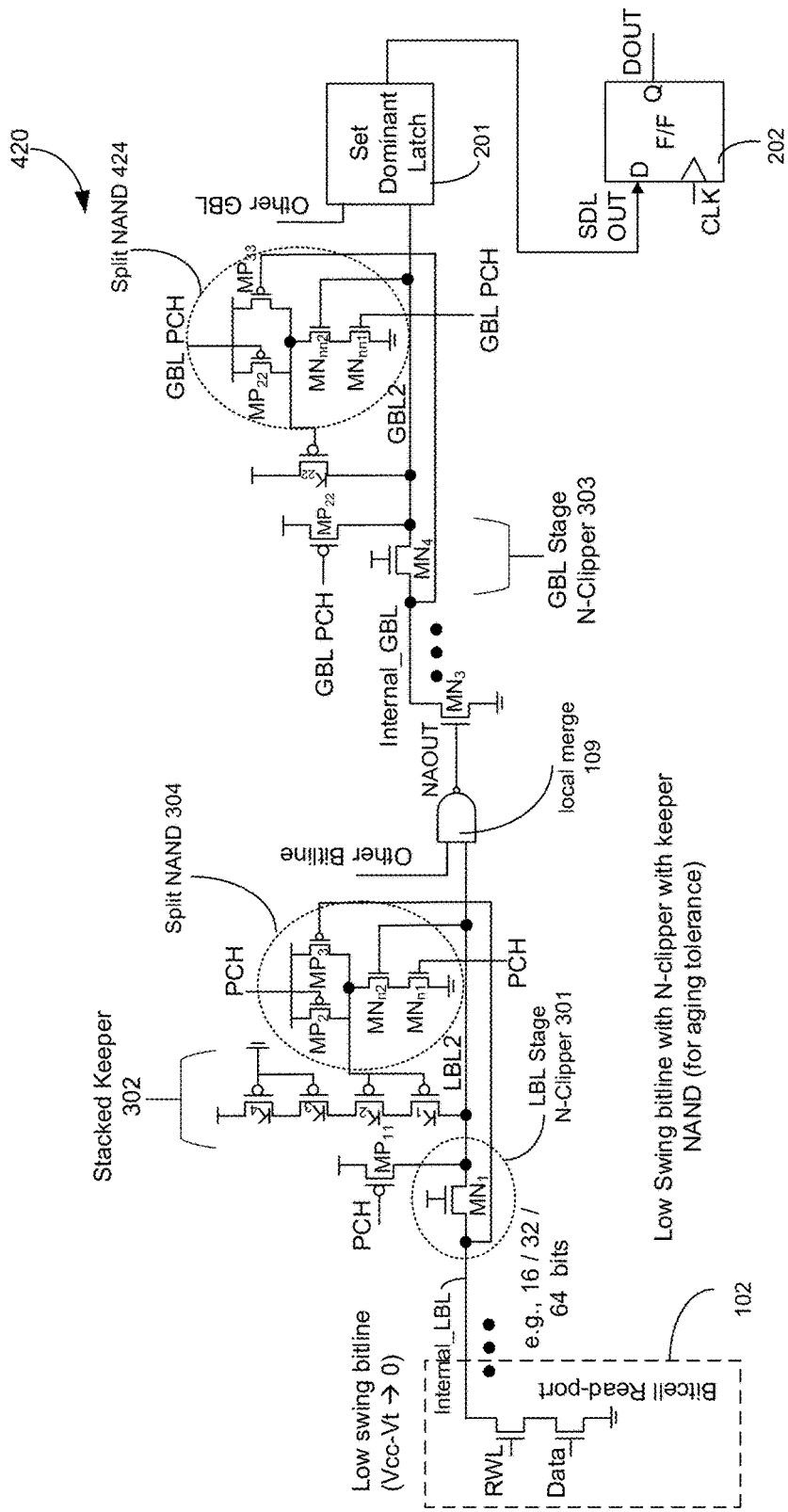
FIG. 4B illustrates apparatus showing low-swing LBL sensing scheme with an n-type clipper and GBL sensing with an n-type clipper, and with split-NAND logic for keeper control on the LBL and GBL, according to some embodiments of the disclosure.

FIG. 4B illustrates apparatus 420 showing low-swing LBL sensing scheme with an n-type clipper and GBL sensing with an n-type clipper, and with split-NAND logic for keeper control on the LBL and GBL, according to some embodiments of the disclosure. It is pointed out that those elements of FIG. 4B having the same reference numbers (or names) as the elements of any other figure can operate or function in any manner similar to that described, but are not limited to such. So as not to obscure the embodiment of FIG. 4B, differences between FIG. 4A and FIG. 4B are described.

In some embodiments, split NAND gate is also introduced on GBL stage, just as it is used on LBL stage, to control a keeper device. Here, split NAND gate 424 cis introduced to control keeper device(s) $K_{22}$. For example, keeper inverter inv2 is replaced with split NAND gate 424 which controls the gate terminal of keeper device(s) $K_{22}$. In some embodiments, split NAND 424 comprises p-type transistors $MP_{22}$ and $MP_{32}$, and n-type transistors $MN_{nn1}$ and $MN_{nn2}$ coupled together as shown. In some embodiments, the gate terminal of $MP_{33}$ is coupled to low swing GBL (i.e., Internal_GBL). In some embodiments, the gate terminal of $MP_{22}$ is controlled by GBL PCH. In some embodiments, the gate terminal of $MN_{nn2}$ is controlled by GBL2. In some embodiments, the gate terminal of $MN_{nn1}$ is controlled by GBL PCH.

In some embodiments, to improve the read path delay further, the Internal_GBL is connected to the gate of transistor $MP_{33}$ of split input NAND gate 424. In some embodiments, as Internal_GBL discharges faster than the gBL2 node, it turns on transistor $MP_{33}$ faster which in turn disables keeper device(s) $K_{22}$. Earlier turning-off keeper devices $K_{22}$ mitigates the keeper contention and improves the read path delay, according to some embodiments.

In some embodiments, during read-1 scenario (e.g., reading a logic high), the voltage on the Internal_GBL and GBL2 nodes discharge to Vss via transistors $MN_3$ and $MN_4$. In some embodiments, the signal on the GBL2 node follows the signal on the Internal_GBL node albeit with additional delay due to series n-type clipper 303 in the read path. In some embodiments, during a transient noise event in a read-0 scenario (e.g., reading a logic 0), the effect of noise is predominant on the Internal_GBL node. The GBL2 node has better noise immunity due to full swing precharge voltage and the shielding effect due to series connected clipper. This property is utilized to improve the noise immunity of the low swing BL technique by decoupling one of the inputs of the keeper controlled NAND gate, in accordance with some embodiments. In some embodiments, transistor $MN_{nn2}$ of split NAND gate 424 is connected to the full swing GBL2 node and the transistor $MP_{33}$ is connected to the low swing Internal_GBL node.

The low swing BL scheme coupled with split input NAND gate 424 for keeper control gives lower read delay and improved aging and noise immunity compared to the conventional full swing sensing scheme, in accordance with some embodiments.

Figure 5A:
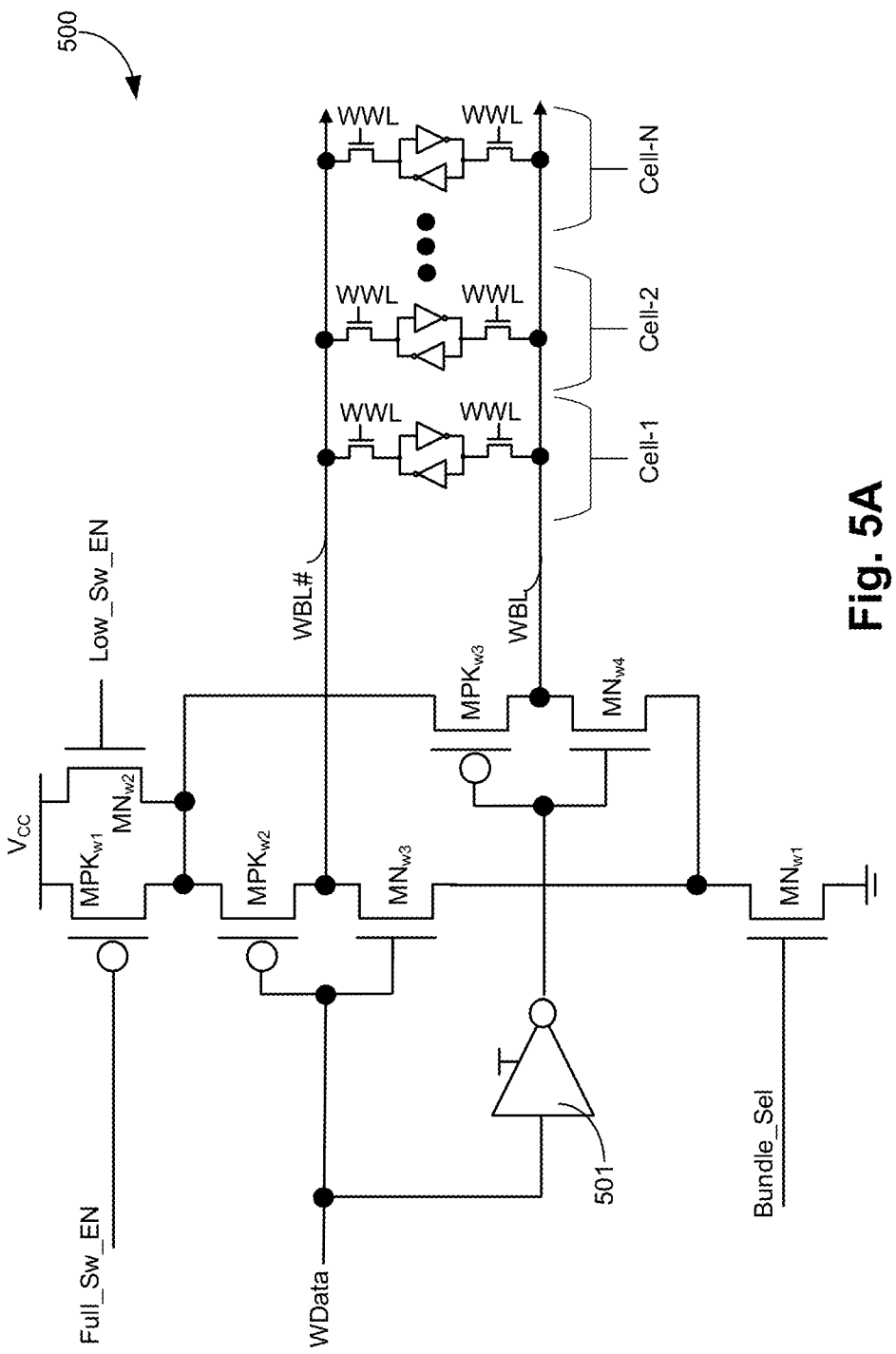
FIG. 5A illustrates an apparatus showing low swing write BL driver, according to some embodiments of the disclosure.

FIG. 5A illustrates apparatus 500 showing low swing write BL driver, according to some embodiments of the disclosure. It is pointed out that those elements of FIG. 5A having the same reference numbers (or names) as the elements of any other figure can operate or function in any manner similar to that described, but are not limited to such.

Most of the dynamic capacitance power for RF write operation is due to the switching of local and global write BLs. One of the ways to reduce the active power for write operation is to reduce local and global BL voltages during write, in accordance with some embodiments. Putting local and global write BL drivers on a separate lower supply than the rest of the logic helps achieve that goal, in accordance with some embodiments. In one such case, such as scheme may need generating a second supply locally (or externally).

In some embodiments, apparatus 500 comprises inverter 501, p-type devices $MPK_{w1}$, $MPK_{w2}$, and $MPK_{w3}$, n-type devices $MN_{w3}$, $MN_{w1}$, $MN_{w2}$, and $MN_{w4}$, Write Data (WData) node, Full_Sw_EN node, Low_Sw_EN node, Bundle_Sel node, Write BL (WBL), and WBL# coupled together as shown. WBL and WBL# are provided to the memory cells (e.g., Cell-1, Cell-2, through Cell-N, where is an integer). Note, Cell-1 is same as bit-cell 0 of FIG. 1.

Referring back to FIG. 5A, in some embodiments, WBL is generated by a current starved inverter (also referred here as write data driver that generates WBL) which comprises the transistors $MPK_{w3}$, $MN_{w4}$, $MN_{w2}$, $MPK_{w1}$, and $MN_{w1}$ coupled together as shown. In some embodiments, transistor $MN_{w2}$ is controlled by Low_Sw_EN. In some embodiments, transistor $MPK_{w1}$ is controlled by Full_Sw_EN. In some embodiments, the gate terminals of $MPK_{w3}$ and $MN_{w4}$ is driven by inverter 501 which provides an inverse of WData. In some embodiments, WBL# (which is logically inverse of WBL) is generated by a current starved inverter (also referred here as write data driver that generates WBL#) which comprises the transistors $MPK_{w2}$, $MN_{w3}$, $MN_{w2}$, $MPK_{w1}$, and $MN_{w1}$ coupled together as shown.

Apparatus 500 provides an inexpensive way of reducing the supply to the local write BL driver. In some embodiments, transistor(s) $MPK_{w1}$ of the write data drivers is disabled by Full_Sw_EN when Vcc is at normal level (e.g., during high supply voltage mode) and enabled when Vcc is at low voltage (e.g., low power mode). In some embodiments, when Vcc is reduced (e.g., during low power mode), transistor $MN_{w2}$ is disabled by Low_Sw_EN while transistor $MPK_{w1}$ is enabled by Full_Sw_EN. As such, Full_Sw_En is enabled at low voltages but at high voltages Full_Sw_En is disabled and Low_Sw_En is enabled so at those conditions the WBL/WBL# are charged to (vcc-vt) and hence dynamic power is saved.

In some sense, transistor $MN_{w2}$ may behave functionally like n-type Clipper 301. As such, transistor $MN_{w2}$ allows to limit the voltage swing on WBL/WBL# to (Vcc-Vt) during write for a selected bundle of memory cells thereby reducing dynamic capacitance (hence power consumption). In some embodiments, when low swing option is enabled, transistor $MN_{w2}$ is introduced in the pull-up path of the write drivers. For lower voltages, full swing BLs are enabled by introducing transistor $MPK_{w1}$ in the pull-up path to avoid any impact on write operation. This approach saves dynamic capacitance at high voltages without compromising on write $Vcc_{MIN}$ at low voltages.

Table 1 shows the control signals and the BL voltage swings for different operating modes.

Here, 8-T (eight transistor) SRAM bit cells are shown (e.g., bit-cell 0, bit-cell 1 . . . bit-cell 15) organized in a column. Each bit-cell receives its own read word-line (RWL#) and write word-line (WWL), and shares write BL (WBL) and its inverse (WBL#) with other bit-cells in the same column. While various embodiments here are described with reference to an 8-T SRAM architecture, the embodiments are also applicable to other types of memories such as 4-T, 6-T, SRAMs, ROMs and CAMs.

Continuing with the example of the 8-T bit-cell, each bit-cell includes a 6-T memory cell 601 and a 2-T read port 602. The 6-T memory cell 601 includes cross-coupled inverters powered by a shared bit-cell Vcc (power supply). The cross-coupled inverters include two p-type transistors and two n-type transistors as shown such that node n0 is input to one inverter and output to the other inverter, and node n1 is input to one inverter and output to the other inverter. The 6-T memory cell includes p-type access devices coupled to nodes n0 and n1, and coupled to WBL and WBL#, respectively. The gate terminals of the access devices (here, p-type devices) are controlled by WWL. For example, for bit-cell 0, the access devices are controlled by WWL0, for bit-cell 1, the access devices are controlled by

TABLE 1

| Case or Scenario | Bundle_Sel | Low_Sw_EN | Full_Sw_En | WBL Swing |
|---|---|---|---|---|
| Selected memory bundle at low voltage | 1 | 0 | 0 | Full-Vcc |
| Selected memory bundle at high voltage | 1 | 1 | 1 | Vcc-Vtn |
| Un-selected bundle during idle mode, for example | 0 | 0 | 1 | Tri-state |

Figure 5B:
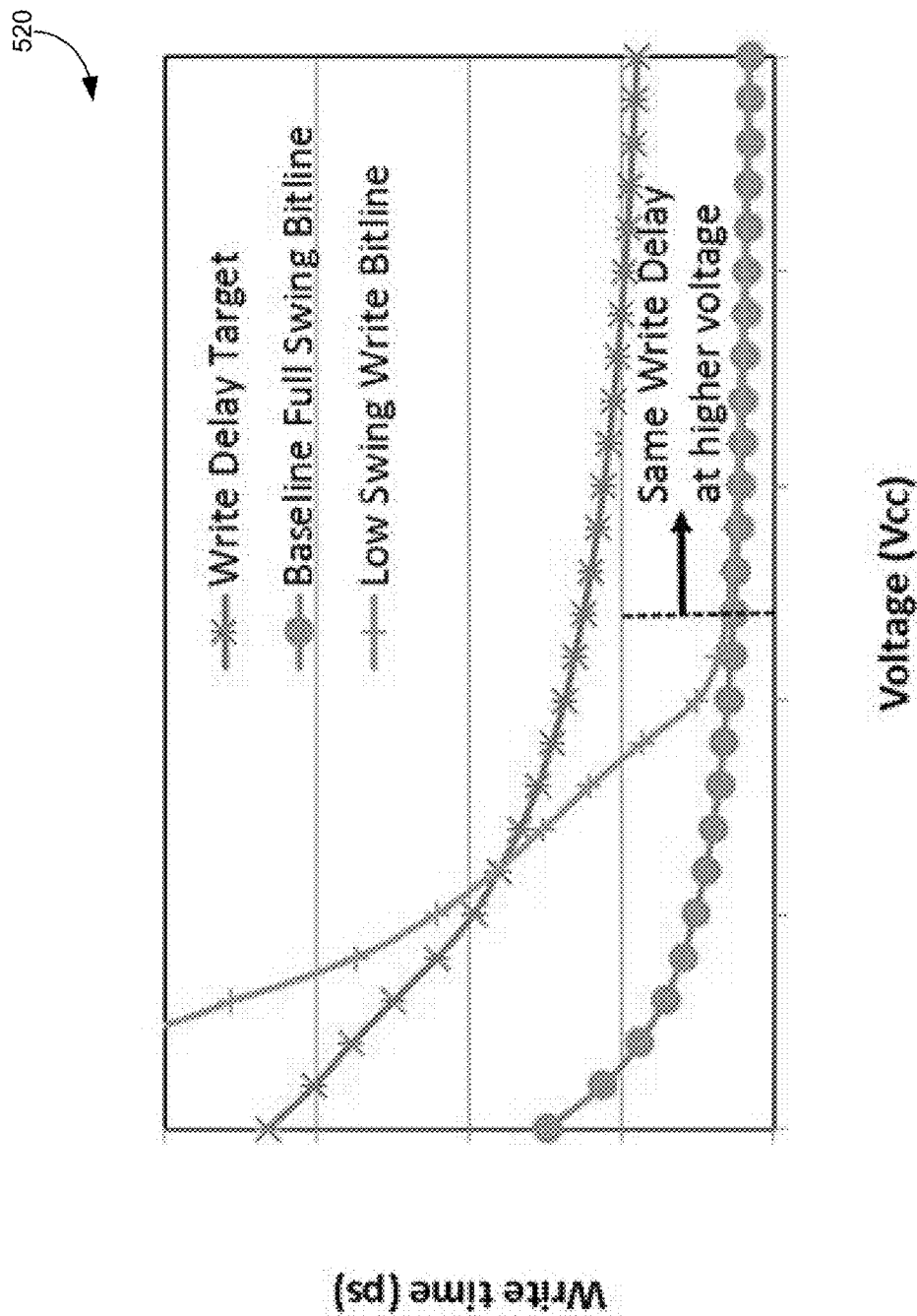
FIG. 5B illustrates plot comparing low swing write BL technique of FIG. 5A with a baseline full swing BL technique of FIGS. 1-2, in accordance with some embodiments of the disclosure.

FIG. 5B illustrates plot 520 comparing low swing write BL technique of FIG. 5A with a baseline full swing BL technique of FIGS. 1-2, in accordance with some embodiments of the disclosure. It is pointed out that those elements of FIG. 5B having the same reference numbers (or names) as the elements of any other figure can operate or function in any manner similar to that described, but are not limited to such.

Here x-axis is supply voltage (Vcc) and y-axis is Write time (in picoseconds (ps)). Plot 520 shows three curves. The Write Delay Target curve is the specification target. Write times are desired to be lower than the specification target for operating supply voltages including $V_{MIN}$. The baseline full swing BL scheme of FIGS. 1-2 results in the fastest write time. Compared to the baseline full swing BL, the low swing write BL scheme results in same write time speed as the write time speed achieved by full swing BL scheme at higher voltages. The low swing on the bitlines may not degrade write delay. At low voltages (e.g., voltage below 0.75V), Full_Sw_En is enabled and Low_Sw_En is disabled. During low swing mode, the write time continues to meet the Write Delay Target (i.e., write time for low swing mode is below the specification target) for lower supply voltages (e.g., near 0.6V of Vcc).

Figure 6:
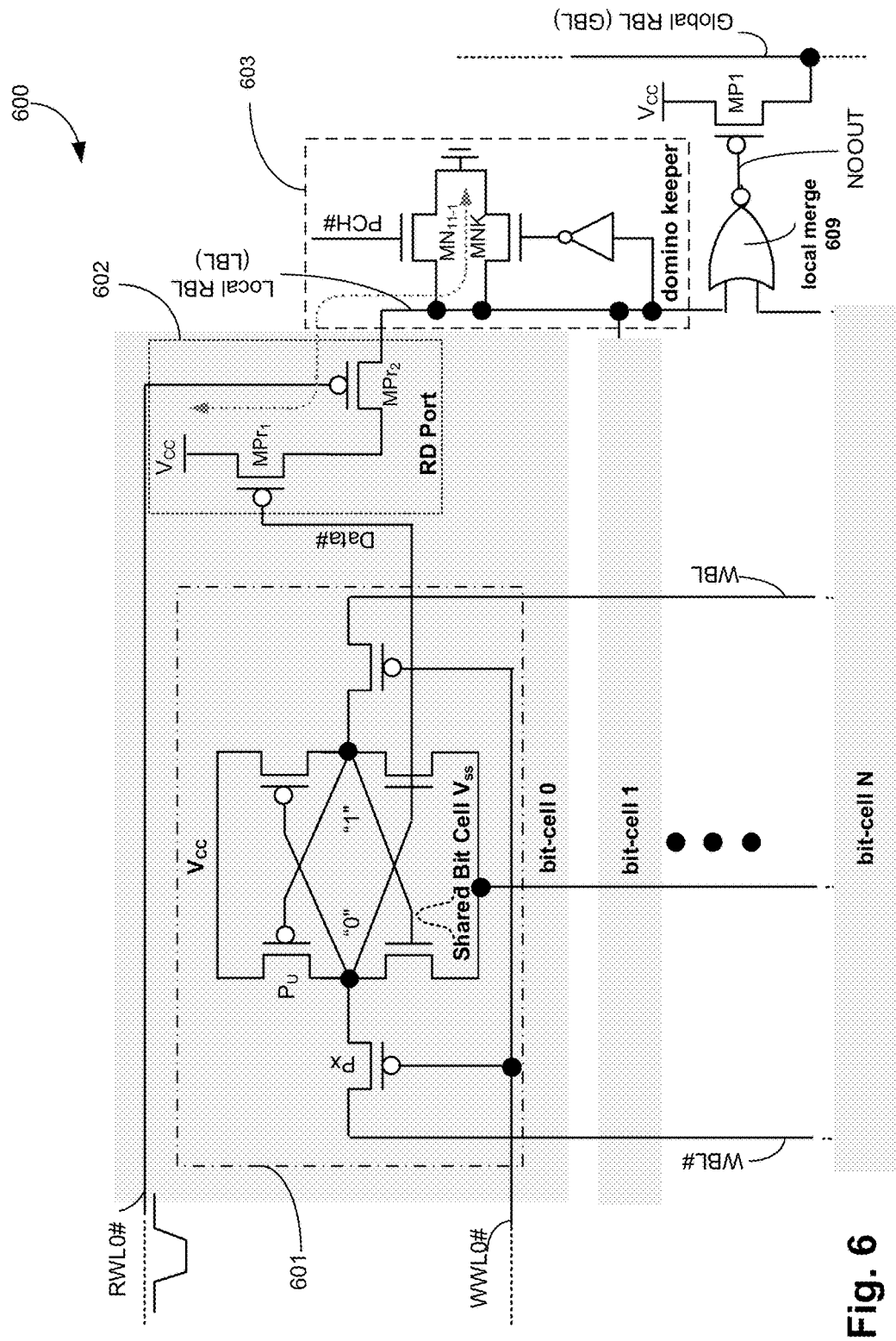
FIG. 6 illustrates a RF with full swing BL operation with a p-type read port.

FIG. 6 illustrates RF 600 with full swing BL operation with p-type read port. FIG. 6 shows baseline one read and one write (1R/1 W) register file design with hierarchical local and global read BLs utilizing single-ended large signal read sensing mechanism. RF 600 includes memory cells (e.g., 601) with read ports (e.g., 602), domino keeper 603, local read bit-line (LBL), local merge logic 609, GBL, read word-lines (RWL#s), write word-lines (WWLs), and write bit-lines (WBLs).

WWL1, and so on such that the access devices for bit-cell 15 are controlled by WWL15.

The read port (RD Port) 602 includes two p-type devices $MP_{r1}$ and $MP_{r2}$. P-type transistor $MP_{r1}$ is coupled in series with transistor $MP_{r2}$. The gate terminal of the p-type transistor $MP_{r2}$ is controlled by RWL#0, while the gate terminal of transistor $MP_{r1}$ is coupled to a data node (e.g., one of nodes n0 or n1). The output of RD Port 602 is LBL. The charge on LBL is held by domino keeper 603. Each LBL may have its own domino keeper. Domino keeper 603 includes a pre-charge n-type transistor $MN_{11-1}$ which is controlled by an inverse pre-charge signal (PCH#). Domino keeper 603 includes a keeper device MNK controlled by an inverter having an input coupled to LBL and an output coupled to the gate terminal of the n-type transistor MNK.

The read port of the multiple bit-cells (e.g., 16, 32, or 64) are evaluated using local read merge NOR gate 609. The outputs of merge NOR gate 609 drive the global BL pullup devices (e.g., p-type transistor MP1). The global BLs (GBLs) are evaluated using a SDL or regular latch. A tristate write BL driver (not shown here) is shared by multiple entries/bundles of memory cells. The tristate write BL driver allows additional power savings by avoiding WBL toggling in unselected bundles of memory cells and also by lowering the driver leakage due to a stacking effect.

Figure 7:
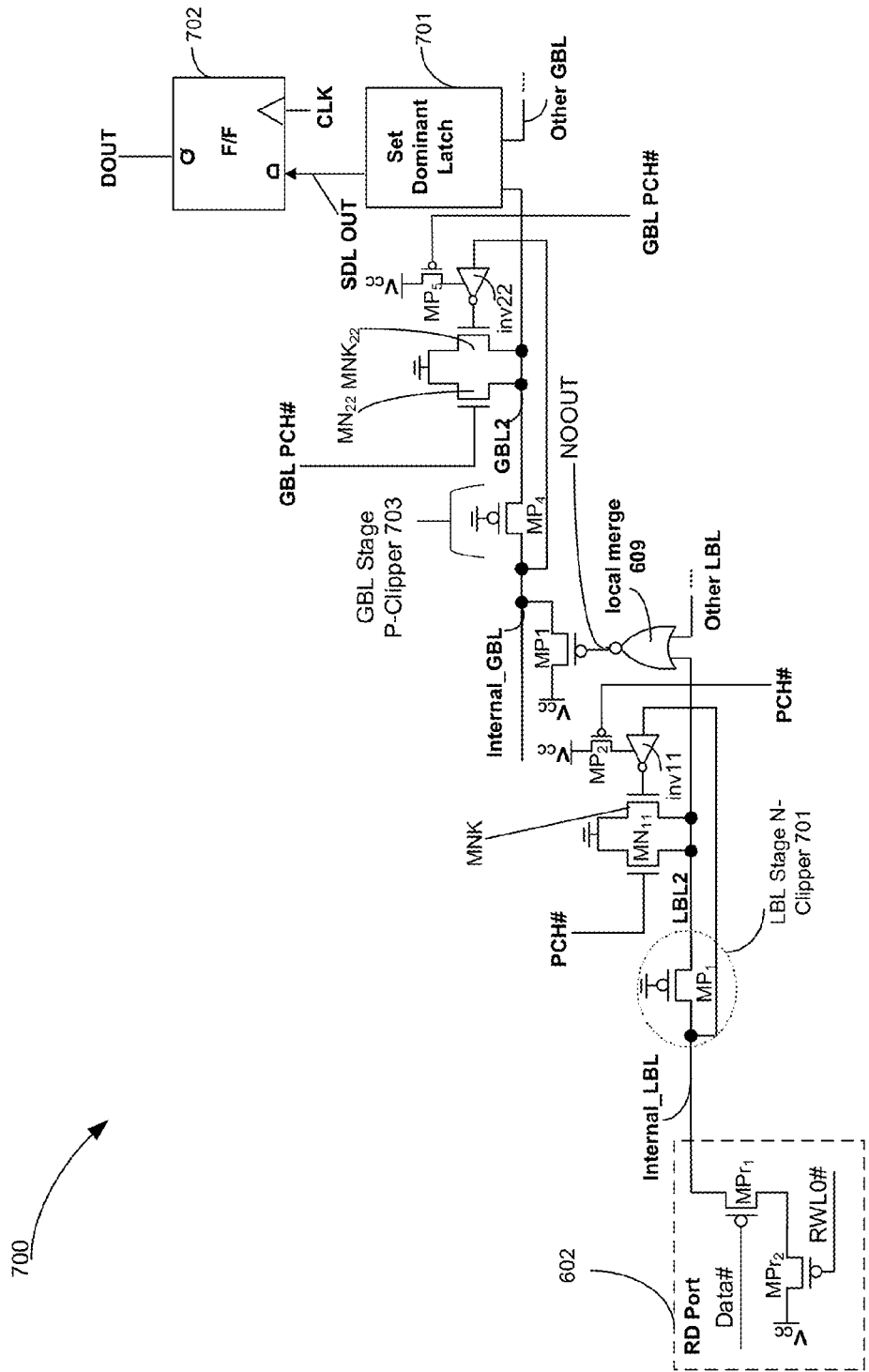
FIG. 7 illustrates an apparatus showing low-swing local read BL sensing scheme with a p-type clipper and global read BL sensing with a p-type clipper, according to some embodiments of the disclosure.

FIG. 7 illustrates apparatus 700 showing low-swing local read BL sensing scheme with p-type clipper and global read BL sensing with a p-type clipper, according to some embodiments of the disclosure. It is pointed out that those elements of FIG. 7 having the same reference numbers (or names) as the elements of any other figure can operate or function in any manner similar to that described, but are not limited to such.

In some embodiments, apparatus 700 comprises a LBL Stage p-type Clipper 701 which is inserted in the LBL such that the LBL is split into Internal_LBL coupled to bit-cell read-port 602 and LBL2. In some embodiments, LBL2 is merged with other LBL2s (e.g., from other read paths) by local merge NOR gate 609. In some embodiments, p-type Clipper 601 is always enabled to be on. For example, the gate terminal of p-type Clipper 601 is coupled to ground (Vss). By inserting p-type Clipper 601 between the bit-cell read port and the local merge NOR gate 609, the voltage swing on higher capacitance Internal_LBL node is reduced by Vtp compared to full swing of Vcc (baseline design). As such, low swing is achieved.

In some embodiments, one or more p-type devices (not shown) are coupled in series with p-type Clipper 601 to further reduce the signal swing on Internal_LBL node, in accordance with some embodiments. In some embodiments, the Internal_LBL node, which is coupled to the bit-cell read ports 602 (having most of the capacitance), is pre-discharged to the lower voltage (|Vtp|) thus lowering the dynamic switching capacitance (CDYN). The low swing BL (i.e., Internal_LBL) partially offsets the delay degradation due to series connected p-type Clipper 601 in the read path.

In some embodiments, apparatus 700 comprises a stacked keeper (not shown) which is coupled to LBL2 node performing the same function as Stacked Keeper 302. In some embodiments, the gate terminal of n-type transistor MNK is controlled by an output of an inverter which inverts the signal on the Internal_LBL node. As such, when the voltage on the Internal_LBL is lower than the switching threshold of the inverter inv11, the voltage on node LBL2 is pulled down to ground transistor MNK.

In some embodiments, the inverter coupled to the n-type transistor MNK is enabled by PCH# (which is an inverse of PCH) via the p-type transistor $MP_2$. In some embodiments, apparatus 700 comprises n-type transistor $MN_{11}$ which is controlled by PCH#. In some embodiments, when PCH# is high, LBL2 is pulled to ground by the n-type transistor $MN_{11}$ while the keeper transistor MNK is disabled by transistor $MP_2$.

As discussed with reference to FIG. 6, the output of the local merge NOR 609 is NOOUT which is received by the pull-up p-type transistor MP1. The transistor MP1 is coupled to the GBL. Referring back to FIG. 7, in some embodiments, p-type Clipper 703 is also added on the GBL just like p-type Clipper 601 is added on the LBL. In some embodiments, p-type Clipper 703 is inserted in the GBL such that the GBL is split into Internal_GBL coupled to the pull-up transistor MP1 and GBL2. In some embodiments, GBL2 is pre-discharged by n-type transistor MN22 which is controlled by GBL PCH#. In some embodiments, a keeper is provided to preserve the charge on GBL2 according to the voltage level of Internal_GBL.

In some embodiments, the keeper comprises an n-type device $MNK_{22}$ which is controlled by an inverter that receives Internal_GBL as input. As such, when the voltage on the Internal_GBL is lower than the switching threshold of the inverter inv22, the voltage on node GBL2 is pulled to Vss (ground) by the keeper device $MNK_{22}$. In some embodiments, the inverter coupled to the n-type transistor $MNK_{22}$ is enabled by the GBL PCH# signal via n-type transistor $MP_5$. GLB2 is received as input by SDL 701. In some embodiments SDL 701 is implemented to be functionally similar to SDL 201. The output SDL OUT of SDL 701 is then sampled by an edge of a clock signal CK input to a flip-flop 702 which provides output DOUT.

Figure 8:
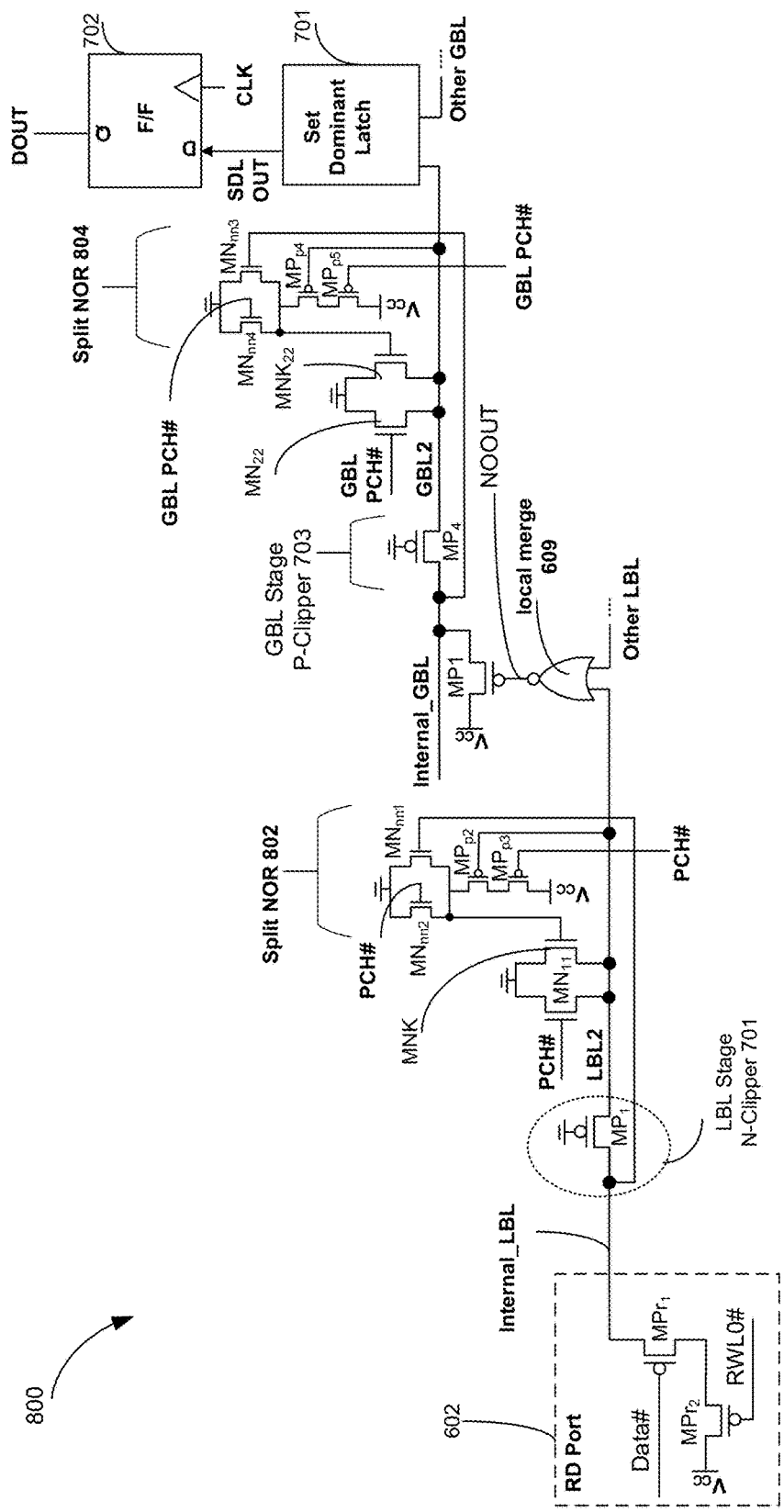
FIG. 8 illustrates an apparatus showing low-swing local read BL sensing scheme with a p-type clipper and global read BL sensing with a p-type clipper, and with split-NOR logic for keeper control, according to some embodiments of the disclosure.

FIG. 8 illustrates apparatus 800 showing low-swing local read BL sensing scheme with a p-type clipper and global read BL sensing with a p-type clipper, and with split-NOR logic for keeper control, according to some embodiments of the disclosure. It is pointed out that those elements of FIG. 8 having the same reference numbers (or names) as the elements of any other figure can operate or function in any manner similar to that described, but are not limited to such.

In some embodiments, a split NOR gate 802 is introduced to control keeper device(s). For example, keeper inverter inv11 (of FIG. 7) is replaced with split NOR gate 802 which controls the gate terminals of keeper device(s) MNK. In some embodiments, split NOR gate 802 comprises n-type transistors $MN_{nn1}$ and $MN_{nn2}$, and p-type transistors $MP_{p3}$ and $MP_{p2}$ coupled together as shown. In some embodiments, the gate terminal of $MN_{nn1}$ is coupled to the Internal_LBL. In some embodiments, the gate terminal of $MP_{p3}$ is controlled by PCH#. In some embodiments, the gate terminal of $MP_{p2}$ is controlled by LBL2. In some embodiments, the gate terminal of $MN_{nn1}$ is controlled by PCH#.

In some embodiments, to improve the read path delay further, the Internal_LBL is connected to the gate of transistor $MN_{nn1}$ of split input NOR gate 802. In some embodiments, as Internal_LBL charges faster than the LBL2 node, it turns on transistor $MN_{nn1}$ faster which in turn disables keeper transistor MNK. Earlier turning-off of keeper stack mitigates the keeper contention and improves the read path delay. As such, in some embodiments, in spite of series p-type clipper 701 in the read path, the read sensing delay is improved using low swing BL and earlier keeper turn-OFF mechanism compared to traditional baseline full swing BL read sensing.

In some embodiments, during the pre-discharge phase, keeper MNK is turned-OFF lowering the voltage stress across the gate oxide of the n-type transistor(s) MNK. This results in reduced keeper aging and improves the noise immunity. In some embodiments, when the other input of split NOR 802 (e.g., input to gate of transistor $MN_{nn1}$ and $MP_{p2}$) is connected to the Internal_LBL node, it results in faster turn-off of keeper MNK and also degrades the noise tolerance as the input to the split NOR gate 802 is biased closer to the switching point.

In some embodiments, during read-0 scenario (e.g., reading a logic low), the voltage on the Internal_LBL and LBL2 nodes charge to Vcc. In some embodiments, the signal on the LBL2 node follows the signal on the Internal_LBL node albeit with additional delay due to series p-type clipper 701 in the read path. In some embodiments, during a transient noise event in a read-1 scenario (e.g., reading a logic high), the effect of noise is predominant on the Internal_LBL node. The LBL2 node has better noise immunity due to full swing precharge voltage and the shielding effect due to series connected clipper. This property is utilized to improve the noise immunity of the low swing BL technique by decoupling one of the inputs of the keeper control NOR gate, in accordance with some embodiments. In some embodiments, transistor $MP_{p2}$ of split NOR gate 802 is connected to the full swing LBL2 node and the transistor $MN_{nn1}$ is connected to the low swing Internal_LBL node.

The low swing BL scheme coupled with split input NOR gate 802 for keeper control gives lower read delay and improved aging and noise immunity compared to the conventional full swing sensing scheme, in accordance with some embodiments. In some embodiments, the low swing BL scheme can be applied to hierarchical BLs utilizing two stage local and global BL sensing schemes.

In some embodiments, the inverter and associated transistor $MP_5$ of FIG. 7 is replaced by split input NOR gate 804. In some embodiments, split NOR gate 804 comprises n-type transistors $MN_{nn3}$ and $MN_{nn4}$, and p-type transistors $MP_{p3}$ and $MP_{p2}$ coupled together as shown. In some embodiments, the gate terminal of $MN_{nn2}$ is coupled to the Internal_GBL. In some embodiments, the gate terminal of $MP_{p5}$ is controlled by GBL PCH#. In some embodiments, the gate terminal of $MP_{p4}$ is controlled by GBL2. In some embodiments, the gate terminal of $MN_{nn4}$ is controlled by PCH#.

In some embodiments, during read-0 scenario (e.g., reading a logic low), the voltage on the Internal_GBL and GBL2 nodes charge to Vcc. In some embodiments, the signal on the GBL2 node follows the signal on the Internal_GBL node albeit with additional delay due to series p-type clipper 703 in the read path. In some embodiments, during a transient noise event in a read-1 scenario (e.g., reading a logic 1), the effect of noise is predominant on the Internal_GBL node. The GBL2 node has better noise immunity due to full swing precharge voltage and the shielding effect due to series connected clipper. This property is utilized to improve the noise immunity of the low swing GBL technique by decoupling one of the inputs of the keeper control NOR gate 804, in accordance with some embodiments. In some embodiments, transistor $MP_{p4}$ of split NOR gate 804 is connected to the full swing GBL2 node and the transistor $MN_{nn3}$ is connected to the low swing Internal_GBL node. The low swing GBL scheme coupled with split input NOR gate 804 for keeper control gives lower read delay and improved aging and noise immunity compared to the conventional full swing sensing scheme, in accordance with some embodiments.

Figure 9:
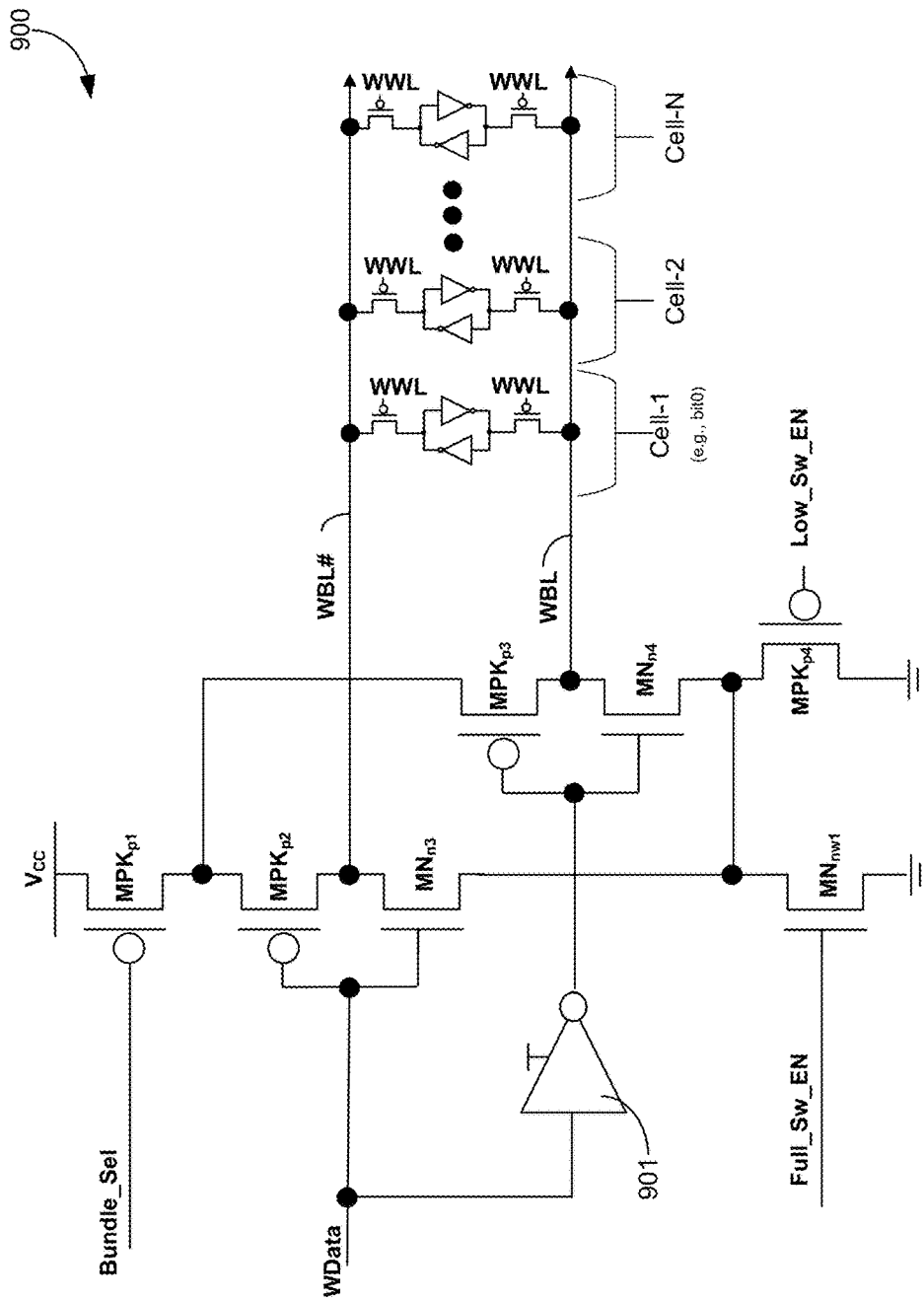
FIG. 9 illustrates an apparatus showing low swing write BL driver, according to some embodiments of the disclosure.
Figure 10:
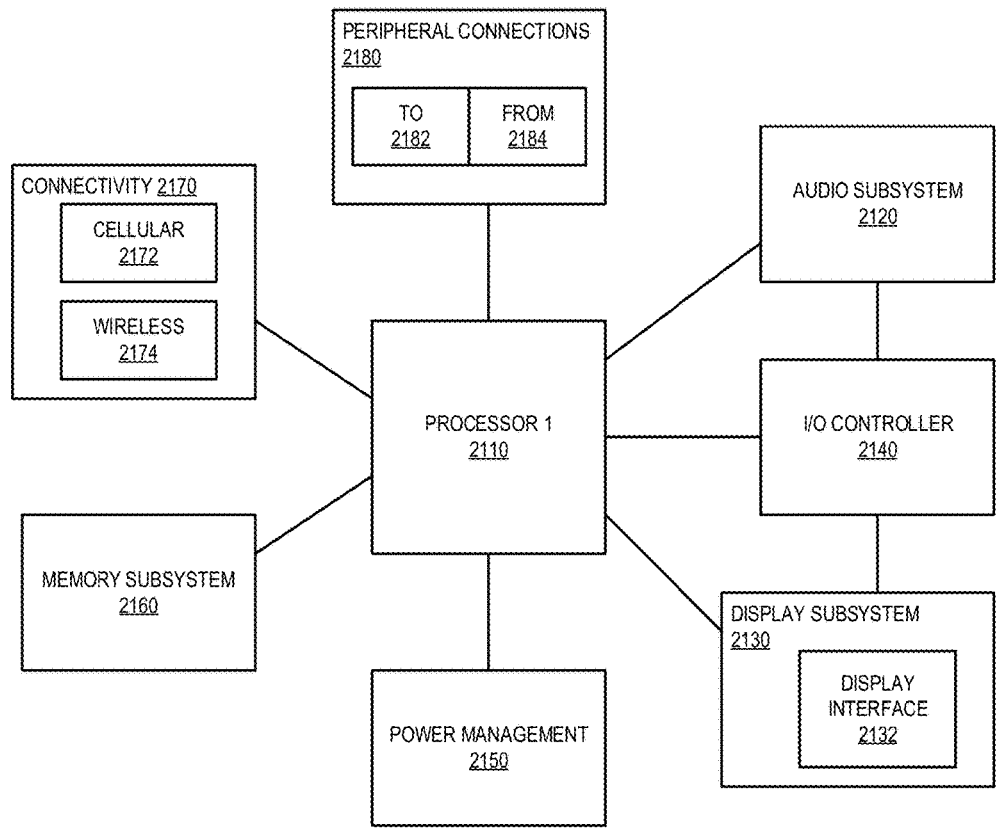
FIG. 10 illustrates a smart device or a computer system or a SoC (System-on-Chip) low-swing local read BL sensing, low-swing global read BL and/or sensing, low-switching write BL driver, in accordance with some embodiments.

FIG. 9 illustrates apparatus 900 showing low swing write BL driver, according to some embodiments of the disclosure. It is pointed out that those elements of FIG. 9 having the same reference numbers (or names) as the elements of any other figure can operate or function in any manner similar to that described, but are not limited to such.

Most of the dynamic capacitance power for a RF write operation is due to the switching of local and global write BLs. One of the ways to reduce the active power for write operation is to reduce local and global BL voltages during write, in accordance with some embodiments. Putting local and global write BL drivers on a separate lower supply than rest of the logic helps achieve that goal, in accordance with some embodiments. In one such case, such as scheme may need generating a second supply locally (or externally).

In some embodiments, apparatus 900 comprises inverter 901, p-type devices $MPK_{p1}$, $MPK_{p2}$, $MPK_{p4}$, and $MPK_{p3}$, n-type devices $MN_{nw1}$, and $MN_{n4}$, and $MN_{n3}$ Write Data (WData) node, Full_Sw_EN node, Low_Sw_EN node, Bundle_Sel node, Write BL (WBL), and WBL# coupled together as shown. WBL and WBL# are provided to the memory cells (e.g., Cell-1, Cell-2, through Cell-N, where 'N' is an integer). Note, Cell-1 is same as bit-cell 0 of FIG. 6.

Referring back to FIG. 9, in some embodiments, WBL is generated by a current starved inverter (also referred here as write data driver that generates WBL) which comprises the transistors $MPK_{p3}$, $MN_{n4}$, $MPK_{p4}$, $MPK_{p1}$, and $MN_{nw1}$ coupled together as shown. In some embodiments, transistor $MNK_{n4}$ is controlled by Low_Sw_EN. In some embodiments, transistor $MN_{nw1}$ is controlled by Full_Sw_EN. In some embodiments, the gate terminals of $MPK_{p3}$ and $MN_{n4}$ is driven by inverter 901 which provides an inverse of WData. In some embodiments, WBL# (which is logically an inverse of WBL) is generated by a current starved inverter (also referred here as write data driver that that generates WBL#) which comprises the transistors $MPK_{p2}$, $MN_{n3}$, $MN_{nw1}$, $MPK_{p1}$, and $MPK_{p4}$ coupled together as shown.

Apparatus 900 provides an inexpensive way of reducing the supply to the local write BL driver. In some embodiments, transistor(s) $MNK_{nw1}$ of the write data drivers is enabled (e.g., turned on) by Full_Sw_EN when Vcc is at lower level to avoid any degradation in write operation (e.g., during low supply voltage mode) and disabled when Vcc is at high voltage (e.g., high power mode). In some embodiments, when Vcc is increased (e.g., during high power mode), transistor $MPK_{p4}$ is enabled by Low_Sw_EN while transistor $MNK_{nw1}$ is disabled (e.g., turned off) by Full_Sw_EN. When transistor $MPK_{p4}$ is enabled and transistor $MNK_{nw1}$ is disabled, the voltage on the source terminals of transistors $MN_{n3}$ and $MN_{n4}$ is raised by the threshold voltage Vt of transistor $MPK_{p4}$ (e.g., the voltage on the source terminals becomes Vss+Vt) which results in lower swing WBL# and WBL.

In some sense, transistor $MPK_{p4}$ may behave functionally like p-type Clipper 701. As such, transistor $MPK_{p4}$ allows to limit the voltage swing on WBL/WBL# to (Vss+Vt) during write for a selected bundle (e.g., via Bundle_Sel) of memory cells thereby reducing dynamic capacitance (hence power consumption). In some embodiments, when low swing option is enabled, transistor $MPK_{p4}$ is introduced in the pull-down path of the write drivers. For higher voltages, full swing BLs are enabled by introducing transistor $MN_{nw1}$ in the pull-down path. This approach saves dynamic capacitance at high voltages without compromising on write $Vcc_{MIN}$ at low voltages.

Table 2 shows the control signals and the BL voltage swings for different operating modes.

TABLE 2

| Case or Scenario | Bundle_Sel | Low_Sw_EN | Full_Sw_En | WBL Swing |
|---|---|---|---|---|
| Selected memory bundle at low voltage | 0 | 1 | 1 | Full-Vcc |
| Selected memory bundle at high voltage | 0 | 0 | 0 | Vss+Vtn |
| Un-selected bundle during idle mode, for example | 1 | 1 | 0 | Tri-state |

FIG. 11 illustrates a smart device or a computer system or a SoC (System-on-Chip) low-swing local read BL sensing, low-swing global read BL and/or sensing, low-switching write BL driver, in accordance with some embodiments. It is pointed out that those elements of FIG. 11 having the same reference numbers (or names) as the elements of any other figure can operate or function in any manner similar to that described, but are not limited to such.

FIG. 11 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 having an RC discharging wake-up network, according to some embodiments discussed. Other blocks of the computing device 2100 may also include low-swing local read BL sensing, low-swing global read BL and/or sensing, low-switching write BL driver according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a bit-line (BL) read port; a first local bit-line (LBL) coupled to the BL read port; a second LBL; and one or more clipper devices coupled to the first and second LBLs such that the first and second LBLs are physically disconnected from one another by the one or more clipper devices. In some embodiments, the one or more clipper devices are always on. In some embodiments, the apparatus comprises a NAND gate which is controllable by a pre-charge node, and coupled to the first and second LBLs. In some embodiments, an output of the NAND gate is coupled to a stacked keeper, which is coupled to the second LBL.

In some embodiments, the apparatus comprises a pre-charge transistor coupled to the second LBL, wherein a gate terminal of the precharge transistor is coupled to the pre-charge node. In some embodiments, the apparatus comprises a NOR gate which is controllable via a pre-charge node, and coupled to the first and second LBLs. In some embodiments, an output of the NOR gate is coupled to a stacked keeper, which is coupled to the second LBL.

In some embodiments, the apparatus comprises a pre-charge transistor coupled to the second LBL, wherein a gate terminal of the precharge transistor is coupled to the pre-charge node. In some embodiments, the BL read port comprises: a first transistor coupled to a read word-line (RWL) and the first LBL; and a second transistor coupled in series with the first transistor, the second transistor coupled to a data node. In some embodiments, the data node is coupled to a bit-cell. In some embodiments, the bit-cell is a SRAM bit-cell.

In another example, a system is provided which comprises a memory; a processor coupled to the memory, the memory including an apparatus according to the apparatus described above; and a wireless interface for allowing the processor to communicate with another device. In some embodiments, the memory is an SRAM.

In another example, an apparatus is provided which comprises: a bit-line (BL) read port; a first local bit-line (LBL) coupled to the BL read port; a second LBL; one or more first clipper devices coupled to the first and second LBLs; a first NAND gate coupled to the second LBL and a third LBL, the first NAND gate to provide an output which is coupled to a gate of a transistor; and a first global BL (GBL) coupled to the transistor; and one or more second clipper devices coupled to the first and second GBLs. In some embodiments, the second GBL is coupled to a set dominant latch (SDL). In some embodiments, the one or more first and second clipper devices are always on. In some embodiments, the apparatus comprises a second NAND gate which is controllable by a pre-charge node, and coupled to the first and second LBLs. In some embodiments, an output of the second NAND gate is coupled to a stacked keeper, which is coupled to the second LBL. In some embodiments, the apparatus comprises a precharge transistor coupled to the second LBL, wherein a gate terminal of the precharge transistor is coupled to the pre-charge node.

In another example, a system is provided which comprises a memory; a processor coupled to the memory, the memory including an apparatus according to the apparatus described above; and a wireless interface for allowing the processor to communicate with another device. In some embodiments, the memory is an SRAM.

In another example, an apparatus is provided which comprises: a keeper circuit coupled to a node and operable to charge the node when the keeper circuit is enabled; and a split-NAND gate coupled to the keeper circuit, wherein the split-NAND gate is to receive inputs from at least three different nodes. In some embodiments, the apparatus comprises a pass transistor coupled to the node and another node, wherein the at least three different nodes are the node, the other node, and a precharge node.

In another example, a system is provided which comprises a memory; a processor coupled to the memory, the memory including an apparatus according to the apparatus described above; and a wireless interface for allowing the processor to communicate with another device. In some embodiments, the memory is an SRAM.

In another example, a method is provided which comprises: precharging a first node; and enabling a keeper circuit to keep change on the first node, the keeper being enabled according to an output of a split-NAND gate. In some embodiments, the method comprises: providing data to a second node; and transmitting the data to the first node. In some embodiments, the method comprises: controlling the split-NAND gate according to the data on the first and second nodes, and data on a precharge node.

In another example, an apparatus is provided which comprises: means for precharging a first node; and means for enabling a keeper circuit to keep change on the first node, the keeper being enabled according to an output of a split-NAND gate. In some embodiments, the apparatus comprises: means for providing data to a second node; and means for transmitting the data to the first node. In some embodiments, the apparatus comprises: means for controlling the split-NAND gate according to the data on the first and second nodes, and data on a precharge node.

In another example, a system is provided which comprises a memory; a processor coupled to the memory, the memory including an apparatus according to the apparatus described above; and a wireless interface for allowing the processor to communicate with another device. In some embodiments, the memory is an SRAM.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a bit-line (BL) read port;
   a first local bit-line (LBL) coupled to the BL read port;
   a second LBL;
   a clipper device coupled to both the first and second LBLs such that the first and second LBLs are physically disconnected from one another by the clipper device, wherein the first and second LBLs are associated with a same bit-cell; and
   a logic gate coupled to the first and second LBLs, wherein the logic gate is controllable by a pre-charge node.

2. The apparatus of claim 1, wherein the clipper device is always on.

3. The apparatus of claim 1, wherein the logic gate comprises a NAND gate which is controllable by the pre-charge node.

4. The apparatus of claim 3, wherein an output of the NAND gate is coupled to a stacked keeper, which is coupled to the second LBL.

5. The apparatus of claim 3 comprises a precharge transistor coupled to the second LBL, wherein a gate terminal of the precharge transistor is coupled to the pre-charge node.

6. The apparatus of claim 1, wherein the logic gate comprises a NOR gate which is controllable via the pre-charge node.

7. The apparatus of claim 6, wherein an output of the NOR gate is coupled to a stacked keeper, which is coupled to the second LBL.

8. The apparatus of claim 6 comprises a precharge transistor coupled to the second LBL, wherein a gate terminal of the precharge transistor is coupled to the pre-charge node.

9. The apparatus of claim 1, wherein the BL read port comprises:
   a first transistor coupled to a read word-line (RWL) and the first LBL; and
   a second transistor coupled in series with the first transistor, the second transistor coupled to a data node.

10. The apparatus of claim 9, wherein the data node is coupled to the bit-cell.

11. The apparatus of claim 10, wherein the bit-cell is a SRAM bit-cell.

12. An apparatus comprising:
    a bit-line (BL) read port;
    a first local bit-line (LBL) coupled to the BL read port;
    a second LBL, wherein the first and second LBLs are associated with a same bit-cell;
    a first clipper device coupled to both the first and second LBLs;
    a first NAND gate coupled to the second LBL and a third LBL, the first NAND gate to provide an output which is coupled to a gate of a transistor; and
    a first global BL (GBL) coupled to the transistor; and
    a second clipper device coupled to both the first and second GBLs.

13. The apparatus of claim 12, wherein the second GBL is coupled to a set dominant latch (SDL).

14. The apparatus of claim 12, wherein the first and second clipper devices are always on.

15. The apparatus of claim 12 comprises a second NAND gate which is controllable by a pre-charge node, and coupled to the first and second LBLs.

16. The apparatus of claim 15, wherein an output of the second NAND gate is coupled to a stacked keeper, which is coupled to the second LBL.

17. The apparatus of claim 15 comprises a precharge transistor coupled to the second LBL, wherein a gate terminal of the precharge transistor is coupled to the pre-charge node.

18. A system comprising:
    a memory;
    a processor coupled to the memory, the memory including an apparatus which includes:
      a bit-line (BL) read port;
      a first local bit-line (LBL) coupled to the BL read port;
      a second LBL, wherein the first and second LBLs are associated with a same bit-cell;
      a clipper device coupled to both the first and second LBLs such that the first and second LBLs are physically disconnected from one another by the clipper device; and
      a logic gate coupled to the first and second LBLs, wherein the logic gate is controllable by a pre-charge node; and a wireless interface to allow the processor to communicate with another device.

19. The system of claim 18, wherein the memory is an SRAM.

20. The system of claim 18, wherein the clipper device is always on.

* * * * *